United States Patent
Yang

(10) Patent No.: US 9,166,403 B2
(45) Date of Patent: Oct. 20, 2015

(54) SERIAL ADVANCED TECHNOLOGY ATTACHMENT DUAL IN-LINE MEMORY MODULE DEVICE

(71) Applicants: HONG FU JIN PRECISION INDUSTRY (ShenZhen) CO., LTD., Shenzhen (CN); HON HAI PRECISION INDUSTRY CO., LTD., New Taipei (TW)

(72) Inventor: Meng-Liang Yang, Shenzhen (CN)

(73) Assignees: HONG FU JIN PRECISION INDUSTRY (ShenZhen) CO., LTD., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 403 days.

(21) Appl. No.: 13/832,421

(22) Filed: Mar. 15, 2013

(65) Prior Publication Data

US 2014/0175905 A1    Jun. 26, 2014

(30) Foreign Application Priority Data

Dec. 26, 2012    (CN) .......................... 2012 1 0571461

(51) Int. Cl.
*H02J 1/00* (2006.01)
(52) U.S. Cl.
CPC ................ *H02J 1/00* (2013.01); *Y10T 307/951* (2015.04)

(58) Field of Classification Search
USPC ......................................... 307/141; 361/748
See application file for complete search history.

(56) References Cited

U.S. PATENT DOCUMENTS

| | | | |
|---|---|---|---|
| 8,432,705 B2 * | 4/2013 | Ge et al. ......................... | 361/785 |
| 2011/0153903 A1 * | 6/2011 | Hinkle et al. .................. | 710/313 |
| 2012/0320538 A1 * | 12/2012 | Wu et al. ....................... | 361/748 |
| 2013/0044424 A1 * | 2/2013 | Yin et al. .................. | 361/679.32 |

* cited by examiner

*Primary Examiner* — Rexford Barnie
*Assistant Examiner* — Joseph Inge
(74) *Attorney, Agent, or Firm* — Novak Druce Connolly Bove + Quigg LLP

(57) ABSTRACT

A serial advanced technology attachment dual in-line memory module device includes first and second electronic switches, a voltage detecting circuit, a power circuit, and an edge connector. The edge connector includes first to third power pins and first and second notches. The first power pins are connected to an input terminal of the voltage detecting circuit. An output terminal of the voltage detecting circuit is connected to first terminals of the first and second electronic switches. The second power pins are connected to the second terminal of the first electronic switch. The third power pins are connected to the second terminal of the second electronic switch. The third terminals of the first and second electronic switches are connected together and also connected to the power circuit.

3 Claims, 1 Drawing Sheet

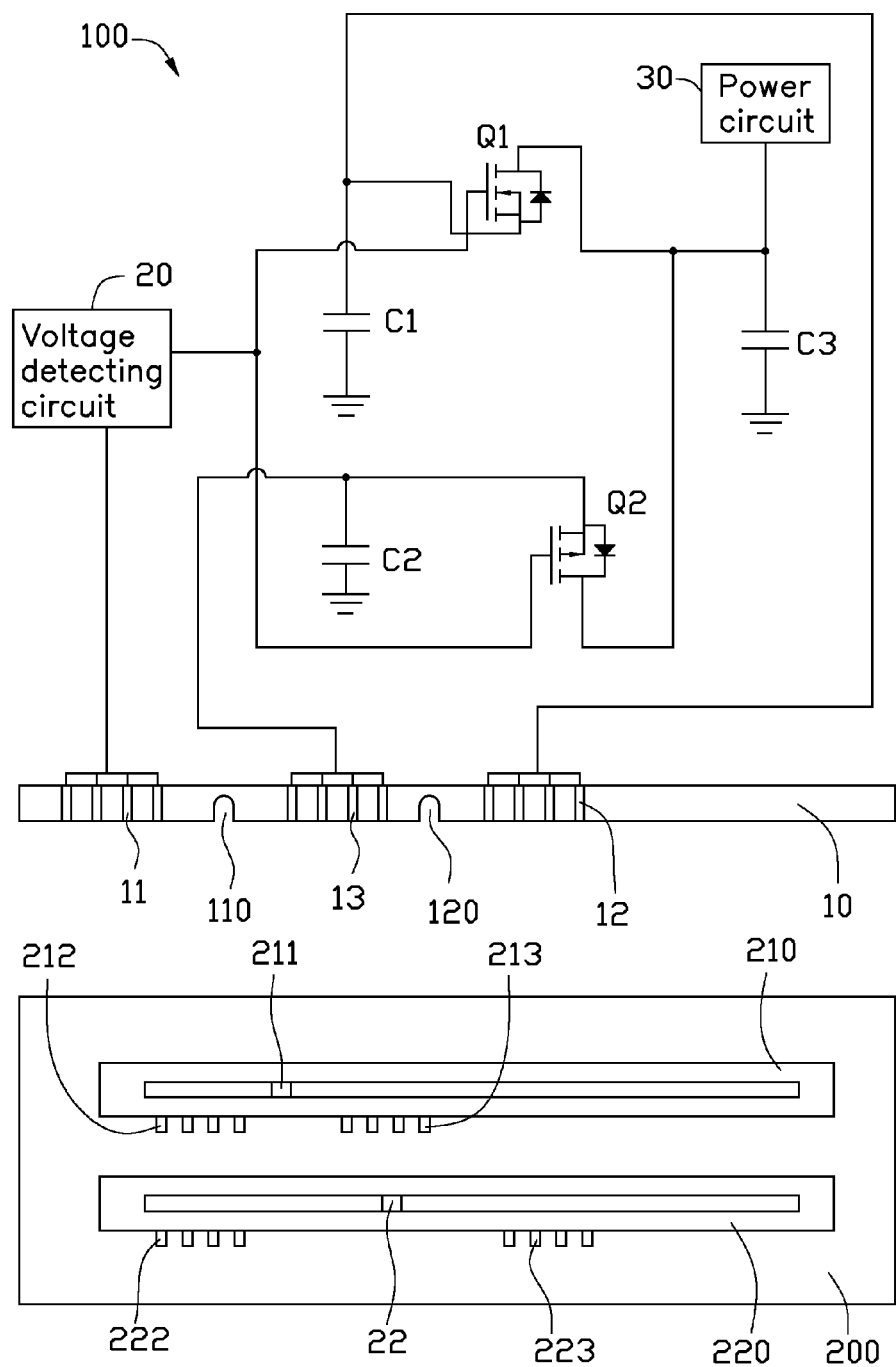

SERIAL ADVANCED TECHNOLOGY ATTACHMENT DUAL IN-LINE MEMORY MODULE DEVICE

BACKGROUND

1. Technical Field

The present disclosure relates to a serial advanced technology attachment dual in-line memory module (SATA DIMM) device.

2. Description of Related Art

Solid state drives (SSD) store data on chips, replacing magnetic or optical discs. One type of SSD has the form factor of a DIMM module and is called a SATA DIMM device. The SATA DIMM device can be inserted into a memory slot of a motherboard, to receive voltages from the motherboard through the memory slot and receive hard disk drive (HDD) signals through SATA connectors arranged on the SATA DIMM device and connected to a SATA connector of the motherboard. However, a traditional SATA DIMM device have a limited number of power pins and when inserted into one of the double data rate type two (DDR2) slots and double data rate type three (DDR3) slot to receive voltages, the low power pin count may not be able to carry a high current, which may damage the SATA DIMM device. Therefore, there is room for improvement in the art.

BRIEF DESCRIPTION OF THE DRAWING

Many aspects of the embodiments can be better understood with reference to the following drawing. The components in the drawing are not necessarily drawn to scale, the emphasis instead being placed upon clearly illustrating the principles of the present embodiments.

The figure is a circuit diagram of a serial advanced technology attachment dual in-line memory module device in accordance with an embodiment of the present disclosure.

DETAILED DESCRIPTION

The disclosure, including the drawing, is illustrated by way of example and not by way of limitation. References to "an" or "one" embodiment in this disclosure are not necessarily to the same embodiment, and such references mean at least one.

The figure shows a serial advanced technology attachment dual in-line memory module (SATA DIMM) device 100 of one embodiment. The SATA DIMM device 100 includes capacitors C1-C3, electronic switches, such as, an n-channel field effect transistor (FET) Q1 and a p-channel FET Q2, a voltage detecting circuit 20, a power circuit 30, and an edge connector 10. Other elements of the SATA DIMM device 100 are known to those skilled in the art of SATA DIMM devices, for example, a SATA connector (not shown) is arranged on the SATA DIMM device 100 and connected to a SATA connector of a motherboard 200, to receive SATA signals.

The edge connector 10 includes a plurality of first power pins 11, a plurality of second power pins 12, a plurality of third power pins 13, and two notches 110 and 120. The third power pins 13 are located between the first power pins 11 and the second power pins 12. The notch 110 is located between the first and third power pins 11 and 13, to engage with a protrusion 211 of a double data rate type three (DDR3) memory slot 210. The notch 120 is located between the second and third power pins 12 and 13, to engage with a protrusion 221 of a double data rate type two (DDR2) memory slot 220. The first power pins 11 correspond to power pins 212 of the DDR3 memory slot 210 and correspond to power pins 222 of the DDR2 memory slot 220. The second power pins 12 correspond to other power pins 223 of the DDR2 memory slot 220. The third power pins 13 correspond to other power pins 213 of the DDR3 memory slot 210.

The first power pins 11 are connected to an input terminal of the voltage detecting circuit 20. An output terminal of the voltage detecting circuit 20 is connected to gates of the FETs Q1 and Q2. A source of the FET Q1 is grounded through a capacitor C1 and also connected to the second power pins 12 of the edge connector 10. A drain of the FET Q1 is connected to the power circuit 30 and also grounded through the capacitor C3. A source of the FET Q2 is grounded through the capacitor C2 and also connect to the third power pins 13 of the edge connector 10. A drain of the FET Q2 is connected to the drain of the FET Q1.

In use, when the edge connector 10 of the SATA DIMM device 100 is inserted into the DDR2 memory slot 220, the protrusion 221 of the DDR2 memory slot 220 engages with the notch 120. The first power pins 11 and the second power pins 12 are connected to the power pins 222 and 223 of the DDR2 memory slot 220, respectively, to receive 1.8 volts (V). The voltage detecting circuit 20 gains a first voltage through the first power pins 11 and outputs a high level signal according to the first voltage. The FET Q1 is turned on. The FET Q2 is turned off. The voltage detecting circuit 20 provides the first voltage to the power circuit 30 through the FET Q1 and the second power pins 12 provide a second voltage received from the motherboard 200 to the power circuit 30 through the FET Q1. The power circuit 30 converts the first and second voltages and provides the converted voltages to other elements of the SATA DIMM device 100. Therefore, the SATA DIMM device 100 can receive voltages from the motherboard 200 through the first power pins 11 and the second power pins 12, to improve input current of the SATA DIMM device 100 and reduce current of the first power pins 11.

When the edge connector 10 of the SATA DIMM device 100 is inserted into the DDR3 memory slot 210, the protrusion 211 of the DDR3 memory slot 210 engages in the notch 110. The first power pins 11 and the third power pins 13 are connected to the power pins 212 and 213 of the DDR3 memory slot 210, respectively, to receive 1.5 volts (V). The voltage detecting circuit 20 gains a third voltage through the first power pins 11 and outputs a low level signal according to the third voltage. The FET Q1 is turned off. The FET Q2 is turned on. The voltage detecting circuit 20 provides the third voltage to the power circuit 30 through the FET Q2 and the third power pins 13 provide a fourth voltage received from the motherboard 200 to the power circuit 30 through the FET Q2. The power circuit 30 converts the third and fourth voltages and provides the converted voltages to other elements of the SATA DIMM device 100. Therefore, the SATA DIMM device 100 can receive voltages from the motherboard 200 through the first power pins 11 and the third power pins 13, to improve input current of the SATA DIMM device 100 and reduce current flowing through the first power pins 11.

The SATA DIMM device 100 can be electrically connected to the DDR2 memory slot 220 or the DDR3 memory slot 210 for receiving a voltage through the first and second power pins 11 and 12 or through the first and third power pins 11 and 13, to improve input current of the SATA DIMM device 100 and reduce current flowing through the first power pins 11.

Even though numerous characteristics and advantages of the disclosure have been set forth in the foregoing description, together with details of the structure and function of the disclosure, the disclosure is illustrative only, and changes may be made in detail, especially in the matters of shape, size, and arrangement of parts within the principles of the disclosure to the full extent indicated by the broad general meaning of the terms in which the appended claims are expressed.

What is claimed is:

1. A serial advanced technology attachment dual in-line memory module (SATA DIMM) device, comprising:
   a first electronic switch comprising first to third terminals;
   a second electronic switch comprising first to third terminals;
   a voltage detecting circuit comprising an input terminal, and an output terminal connected to the first terminals of the first and second electronic switches;
   a power circuit connected to the third terminals of the first and second electronic switches; and
   an edge connector comprising:
      a plurality of first power pins connected to the input terminal of the voltage detecting circuit;
      a plurality of second power pins connected to the second terminal of the first electronic switch;
      a plurality of third power pins connected to a second terminal of the second electronic switch, wherein the plurality of third power pins is located between the plurality of first power pins and the plurality of second power pins;
      a first notch arranged on the edge connector and located between the first and third power pins; and
      a second notch arranged on the edge connector and located between the second and third power pins;
   wherein when the edge connector is connected to a double data rate type two (DDR2) memory slot, the second notch receives a protrusion of the DDR2 memory slot, the voltage detecting circuit gains a first voltage through the first power pins and outputs a first control signal according to the first voltage for controlling the first electronic switch to be turned on, the second electronic switch is turned off, the voltage detecting circuit provides the first voltage to the power circuit through the first electronic switch and the second power pins provide a second voltage received from a motherboard mountable with the DDR2 memory slot to the power circuit through the first electronic switch; and
   wherein when the edge connector is connected to a double data rate type three (DDR3) memory slot of the motherboard, the first notch receives a protrusion of the DDR3 memory slot, the voltage detecting circuit gains a third voltage through the first power pins and outputs a second control signal according to the third voltage for controlling the first electronic switch to be turned off, the second electronic switch is turned on, the voltage detecting circuit provides the third voltage to the power circuit through the second electronic switch and the third power pins provides a fourth voltage received from the motherboard to the power circuit through the second electronic switch.

2. The SATA DIMM device of claim 1, further comprising first to third capacitors, wherein the first capacitor is connected between the second terminal of the first electronic switch and ground, the second capacitor is connected between the second terminal of the second electronic switch and ground, the third capacitor is connected between the third terminals of the first and second electronic switches and ground.

3. The SATA DIMM device of claim 2, wherein the first electronic switch is a n-channel field effect transistor (FET), the second electronic switch is a p-channel FET, the first to third terminals of the first and second electronic switches are gates, sources, and drains of the FETs.

* * * * *